United States Patent [19]

Hankel

[11] 4,024,418
[45] May 17, 1977

[54] INTEGRATED CIRCUIT CMOS INVERTER STRUCTURE

[75] Inventor: Rainer Hankel, Berlin, Germany

[73] Assignee: Robert Bosch G.m.b.H., Stuttgart, Germany

[22] Filed: Feb. 4, 1976

[21] Appl. No.: 655,074

[30] Foreign Application Priority Data

Mar. 15, 1975  Germany .......................... 2511488

[52] U.S. Cl. ................................ 307/304; 307/205;
307/213; 307/214; 330/35; 357/23; 357/42
[51] Int. Cl.² ................. H03K 19/08; H03K 19/40;
H01L 29/78
[58] Field of Search .......... 307/205, 213, 214, 237,
307/304; 357/41, 42, 23; 330/35

[56] References Cited

UNITED STATES PATENTS

| | | | |
|---|---|---|---|
| 3,500,062 | 3/1970 | Annis | 307/205 X |
| 3,510,684 | 5/1970 | Martin | 307/251 X |
| 3,512,058 | 5/1970 | Khajezadeh | 357/41 |
| 3,539,928 | 11/1970 | Gardner et al. | 307/251 X |
| 3,673,428 | 6/1972 | Athanas | 357/42 X |
| 3,855,549 | 12/1974 | Heuner et al. | 307/213 X |

OTHER PUBLICATIONS

"COS/MOS Integrated Circuits Manual"; RCA Corp.; RCA/Solid State Division; pp. 14–17; 30–33; 1972.
Marcus, "Odd/Even Shunt Circuits"; IBM Tech. Discl. Bull.; vol 17, No. 8, pp. 2234–2236; 1/1975.

Primary Examiner—John S. Heyman
Assistant Examiner—Larry N. Anagnos
Attorney, Agent, or Firm—Flynn & Frishauf

[57] ABSTRACT

To provide for feedback between output and input, a high-resistance feedback circuit is formed of two serially connected oppositely poled semiconductor diodes, integrated with the two complementary MOS transistors on a common semiconductor chip. Preferably, the diodes are located within a window formed in the guard bands on the chip, alongside one of the transistors, and connected with conductive strips to the respective input and output terminals of the transistors.

6 Claims, 4 Drawing Figures

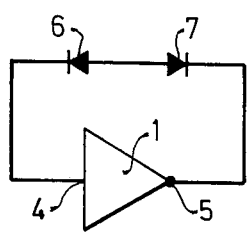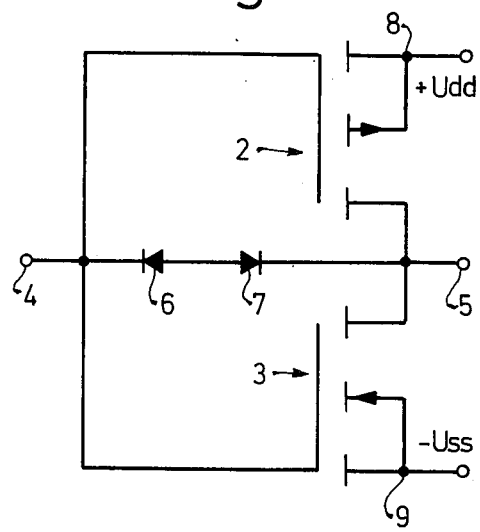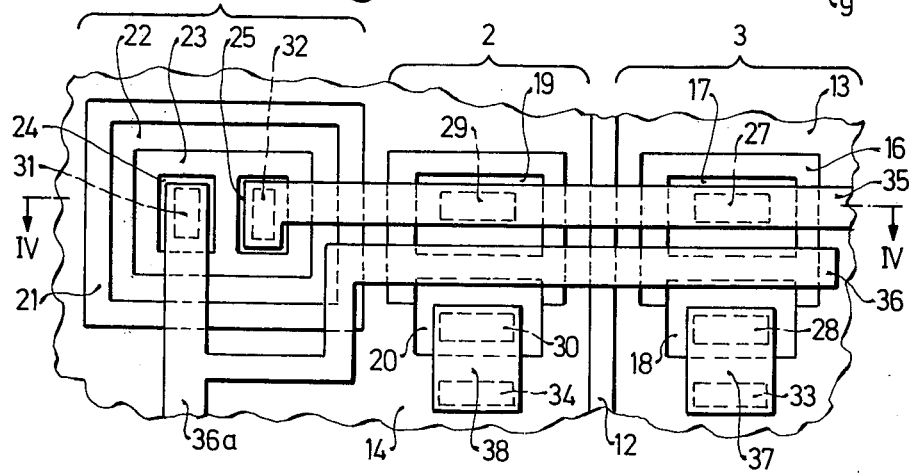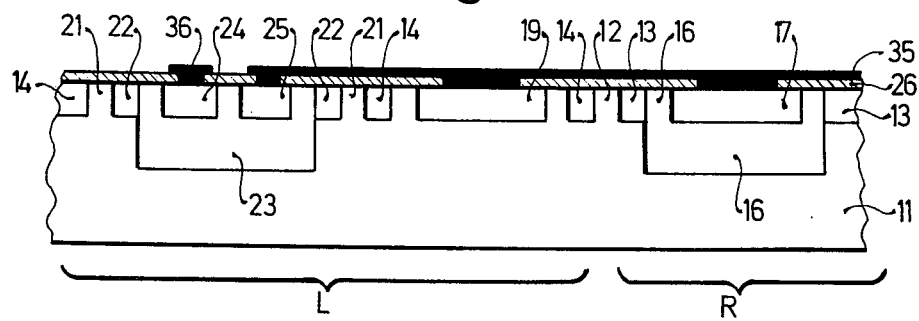

INTEGRATED CIRCUIT CMOS INVERTER STRUCTURE

The present invention relates to an inverter structure and circuit in integrated circuit form in which two complementary MOS transistors have their outputs coupled back to the input by means of a feedback circuit to positively fix the d-c working point of the inverter circuit.

It has previously been proposed to provide a feedback circuit in CMOS inverters having a high resistance ohmic resistor. The resistance value is in the order of magnitude of 10 meg-ohms or more, preferably higher. This structure has the disadvantage that the ohmic resistor must be constructed as a separate discrete element which is externally connected to the CMOS inverter.

It is an object of the present invention to provide a fully integrated inverter circuit in which all circuit components can be integrated on a single chip.

SUBJECT MATTER OF THE PRESENT INVENTION

Briefly, the feedback circuit for complementary transistors is formed of two oppositely poled serially constructed semiconductor diodes. The two serially connected semiconductor diodes are integrated with the two complementary MOS transistors on a common semiconductor chip.

The invention will be described by way of example with reference to the accompanying drawings, wherein:

FIG. 1 is a schematic circuit diagram of the CMOS inverter;

FIG. 2 is a detailed electrical diagram of the CMOS inverter;

FIG. 3 is a top view of the integrated circuit structure of the inverter of FIGS. 1 and 2; and FIG. 4 is a cross section along lines IV—IV of FIG. 3.

The inverter 1 (FIGS. 1, 2) has two complementary MOS field effect, transistors 2, 3 (FIG. 2). The transistor 2 is a p-channel transistor; the transistor 3 is an n-channel transistor. The control electrodes of the two transistors 2, 3 are connected together and form the input 4 of the inverter. The drain electrodes of the two transistors are also connected together and form the output connected to terminal 5 of the inverter. The source electrode 8 of the p-channel transistor 2 is connected to the positive terminal of a supply voltage $U_{dd}$; the source electrode 9 of the n-channel transistors is connected to the negative supply voltage $-U_{ss}$. A feedback circuit is connected from the output terminal 5 of the inverter 1 to its input terminal 4.

In accordance with the present invention, the feedback circuit from the output terminal 5 to the input terminal 4 has two oppositely poled serially connected semiconductor diodes 6, 7. The entire circuit structure, including the diodes 6, 7, can be integrated on a single semiconductor chip substrate.

One possible form of a layout for the inverter is shown in FIGS. 3 and 4. The entire circuit arrangement, schematically illustrated in FIG. 1 and in greater detail illustrated in FIG. 2, is placed on a single semiconductor chip, for example of silicon. This chip may contain additional circuit elements, not shown. A monolithic integrated circuit structure is thus provided. The semiconductor substrate 11 preferably is n-conductive silicon.

A narrow strip 12 (FIG. 3), at which the substrate chip material 11 appears at the surface thereof, divides the chip into a left portion L and a right portion R. The right portion R of the semiconductor structure is embedded into a guard band 13 which is $p^+$-conductive. The left portion L is embedded in an $n^+$-conductive guard band, which includes a second $p^+$-conductive guard band 22 as an island structure formed in a window thereof.

The right portion R of the semiconductor structure has the n-channel transistor 3 located within the $p^+$-conductive guard band 13. A first p-well diffusion zone 16 is diffused in the $p^+$-conductive guard band 13 and in the n-conductive semiconductor substrate 11 therebeneath. Diffusion is from the top surface of the semiconductor chip. The drain zone 17 of the n-channel transistor is diffused in the first p-well diffusion zone 16 spaced from the $p^+$-conductive guard band 13. The $N^+$-conductive source zone 18 of the n-channel transistor 3 is diffused into the p-well diffusion zone 16 partly without being spaced from the $p^+$-conductive guard band 13.

The left portion L of the semiconductor structure includes the p-channel transistor 2 within the $n^+$-conductive guard bands 14. The $p^+$-conductive drain zone 19 and the $p^+$-conductive source zone 20 of the p-channel transistor 2 are diffused from the top side of the semiconductor chip within the guard bands 14 into the substrate 11 which, in this region, is surrounded in ring-shaped manner by the guard band 14. The $p^+$-conductive source zone 20 of the p-channel transistor 2 is located, in part, without spacing with respect to the $n^+$-conductive guard band 14.

Semiconductor diodes 6, 7 are also located at the left portion L of the semiconductor structure. A special region or zone is provided for the semiconductor diodes 6, 7, forming an island within the $n^+$-conductive guard bands 14. The outer edge of this island is formed by a ring-shaped narrow strip 21 along which the n-conductive semiconductor substrate material of the substrate chip 11 is exposed at the surface thereof. A second $p^+$-conductive guard band 22 is diffused in the semiconductor substrate material within the ring-shaped narrow strip 21. A second p-well diffusion zone 23 is diffused within guard band 22 into the semiconductor substrate material which forms the common anode zone of the two semiconductor diodes 6, 7, poled oppositely with respect to each other, and serially connected. The second p-well diffusion zone 23 has first and second $n^+$-conductive diffusion zones 24, 25 diffused therein. The first diffusion zone 24 forms the cathode for the semiconductor diode 6 and the second diffusion zone 25 forms the cathode for the semiconductor diode 7.

A silicon dioxide layer 26 (FIG. 4) covers the semiconductor chip at its surface. This layer 26 has been omitted from FIG. 3 for clarity of illustration thereof. The silicon dioxide layer 26 is etched away at those portions of the semiconductor chip which form contact windows for connection to the circuit elements contained on the semiconductor chip.

The n-channel transistor 3 is formed with a first contact window 27 at its $N^+$-conductive drain zone 17 and with a second contact window 28 at its $n^+$-conductive source zone 18.

The p-channel transistor 2 is formed with a first contact window 29 at its $p^+$-conductive drain zone; it is fromed with a second contact window 30 at its p⁺-conductive source zone 20.

Semiconductor diode 6 has a contact window 31 at its cathode zone 24. Semiconductor diode 7 has a contact window 32 at its cathode zone 25.

A contact window 33 is formed in the vicinity of contact window 28 on the first p⁺-conductive guard band 13. The n⁺-conductive guard band 14 has a contact window 34 in the vicinity of contact window 30.

A metallizing layer is applied on the silicon dioxide layer 26. This metal layer contacts the semiconductor surface at those zones or regions in which the layer 26 is etched off. The metallizing coating forms a first conductive strip 35 which connects contact windows 27, 29, 32. The right end of the contact strip 35 forms the output terminal 5 of the inverter. The metallizing coating also forms a second conductive strip 36 which connects contact window 31 with the cathode zone 34 of the semiconductor diode 6. It does not contact the semiconductor surface at any other position, however. The second contact strip 36 is carried over the zones of the channels of the two MOS transistors 2 and 3 and forms the control electrodes for these two transistors. The second conductive path 36 has a branch 36a which forms the input terminal 4 of the inverter. The conductive layer also is formed into third and fourth conductive bridges 27, 38. The bridge 37 forms the source electrode 9 of the n-channel transistor 3 and connects the two contact windows 28, 33. The fourth conductive bridge 38 forms the source electrode 8 for the p-channel transistor 2 and connects the two contact windows 30, 34. The third conductive strip 37 is connected to the negative supply voltage $-U_{ss}$ and the fourth conductive strip 38 is connected to the positive supply voltage $+U_{dd}$.

Various structural and layout changes may be made within the scope of the inventive concept.

I claim:

1. Integrated circuit inverter structure comprising
a semiconductor chip (11);
two complementary MOS transistors (2, 3) formed on the chip, each having a control electrode and a drain electrode, the control electrodes of the transistors being connected together and forming the input (4) of the inverter and the drain electrodes of the transistors being connected together and forming the output (5) of the inverter,
and comprising in accordance with the invention
a high-resistance independent feedback circuit connected only to the inverter output (5) and to the inverter input (4) to stabilize the working point thereof having a feedback impedance in the order of about at least 10 Megohms and
formed by two oppositely poled, serially connected semiconductor diodes (6, 7), in which their common terminals comprise a single unconnected electrode, integrated with the transistors (2, 3) on the same semi-conductor chip (11) to form a common integrated inverter structure on a single chip substrate.

2. Structure according to claim 1, wherein the transistors are located within guard bands (13, 14) formed on the chip, and the diodes are located within an island formed within the guard band of one of the transistors.

3. Structure according to claim 1, wherein the single electrode of the two semiconductor diodes is formed as a single zone of a first conductivity, to provide the common terminal for both said diodes, and two zones of opposite conductivity diffused in said single zones, and contact means connecting the input, and the output of the inverter, respectively, to said respective zones of opposite conductivity.

4. Structure according to claim 3, wherein the contact means are connected only to said zones of opposite conductivity.

5. Structure according to claim 3, wherein the chip is n-conductive silicon chip, and said single zone is formed by a p-conductive well (23) diffused into the n-conductive chip, two zones of N⁺ conductivity (24, 25) are diffused into the p-conductive well to form said two zones of opposite conductivities;
input and output conductive strips (36, 35) commonly connecting the complementary MOS transistors on the chip and additionally connecting, respectively, with the two zones (24, 25) of little n-conductivity;
and a cover of insulating material (26) over said chip and over said well in locations not covered by the input and output strips, said cover of insulating material covering the portions of p-conductive well at the surface of the chip.

6. Structure according to claim 1, wherein the chip is an n-conductive silicon chip;
a p-type conductive well (23) is diffused into n-conductive chip;
two zones of N⁺-conductivity (24, 25) are diffused into the p-conductivity well to form, together with said well, said two oppositely poled semi-conductive diodes (6, 7);
input and output conductive strips (36, 35) are provided, commonly connecting the complementary MOS transistors on the chip and additionally connecting respectively, with said two zones (24, 25) of n-conductivity;
and a cover of insulating material (26) is provided over said chip and over said well in locations not covered by the input and output strips, said cover of insulating material covering portions of the p-conductive well at the surface of the chip whereby said surface will be unconnected while forming, within said chip, the common terminal for said oppositely poled, serially connected semi-conductor diodes.

* * * * *